(12) United States Patent
Pepori et al.

(10) Patent No.: US 8,079,519 B2
(45) Date of Patent: Dec. 20, 2011

(54) STRUCTURE INCLUDING AN ELECTRONIC DEVICE FOR MAKING A SECURITY DOCUMENT

(75) Inventors: Paolo Pepori, Lomagna (IT); Pierre Doublet, Saint Brice (FR)

(73) Assignee: Arjowiggins Security, Issy les Moulineaux (FR)

( * ) Notice: Subject to any disclaimer, the term of this patent is extended or adjusted under 35 U.S.C. 154(b) by 511 days.

(21) Appl. No.: 11/666,218

(22) PCT Filed: Oct. 28, 2005

(86) PCT No.: PCT/FR2005/050914
§ 371 (c)(1),
(2), (4) Date: Apr. 3, 2009

(87) PCT Pub. No.: WO2006/048577
PCT Pub. Date: May 11, 2006

(65) Prior Publication Data
US 2009/0294534 A1     Dec. 3, 2009

(30) Foreign Application Priority Data
Oct. 29, 2004   (FR) ..................... 04 52488

(51) Int. Cl.
| | |
|---|---|
| *G06K 5/00* | (2006.01) |
| *G06K 7/06* | (2006.01) |
| *G06K 19/00* | (2006.01) |
| *G06K 19/02* | (2006.01) |
| *G06K 19/06* | (2006.01) |
| *G08B 13/14* | (2006.01) |

(52) U.S. Cl. ........ 235/439; 235/441; 235/487; 235/488; 235/491; 340/572.1; 340/572.8

(58) Field of Classification Search ............... 235/439, 235/441, 486–488, 491–492; 340/572.1–572.8
See application file for complete search history.

(56) References Cited

U.S. PATENT DOCUMENTS

| | | |
|---|---|---|
| 4,474,292 A | 10/1984 | Haghiri-Tehrani et al. |
| 5,528,222 A | 6/1996 | Moskowitz et al. |
| 5,741,392 A | 4/1998 | Droz |

(Continued)

FOREIGN PATENT DOCUMENTS

EP    1 010 155 B1    6/2000

(Continued)

OTHER PUBLICATIONS

Dec. 17, 2009 Office Action issued in European Patent Application No. 06022214.8 (with translation).

*Primary Examiner* — Michael G Lee
*Assistant Examiner* — Laura Gudorf
(74) *Attorney, Agent, or Firm* — Oliff & Berridge, PLC

(57) ABSTRACT

The present invention provides a method of making a structure for making a security document and/or a document of value, or for making an article secure, the structure comprising at least one electronic device and at least one at least partially fibrous layer having a window arranged to receive the electronic device, at least in part, the method comprising the following steps:
   placing at least part of the electronic device in the window in the layer; and then
   depositing a resin in the window so as to encapsulate the electronic device, at least in part.

19 Claims, 6 Drawing Sheets

U.S. PATENT DOCUMENTS

| | | |
|---|---|---|
| 6,025,054 A * | 2/2000 | Tiffany, III .................... 428/189 |
| 6,076,737 A * | 6/2000 | Gogami et al. ................ 235/492 |
| 6,100,804 A * | 8/2000 | Brady et al. ................ 340/572.7 |
| 6,116,298 A | 9/2000 | Haimovich et al. |
| 6,233,818 B1 | 5/2001 | Finn et al. |
| 6,305,609 B1 | 10/2001 | Melzer et al. |
| 6,353,420 B1 * | 3/2002 | Chung .......................... 343/895 |
| 2002/0135481 A1 | 9/2002 | Conwell et al. |
| 2002/0190132 A1 | 12/2002 | Kayanakis |
| 2004/0065743 A1 * | 4/2004 | Doublet ........................ 235/487 |
| 2005/0066513 A1 * | 3/2005 | Kayanakis et al. .......... 29/592.1 |

FOREIGN PATENT DOCUMENTS

| | | |
|---|---|---|
| GB | 2 279 907 A | 1/1995 |
| JP | A-2001-092934 | 4/2001 |
| WO | WO 99/10852 A1 | 3/1999 |
| WO | WO 99/44172 A1 | 9/1999 |
| WO | WO 00/42569 A1 | 7/2000 |
| WO | WO 01/45040 A2 | 6/2001 |
| WO | WO 2004/049247 A1 | 6/2004 |

* cited by examiner

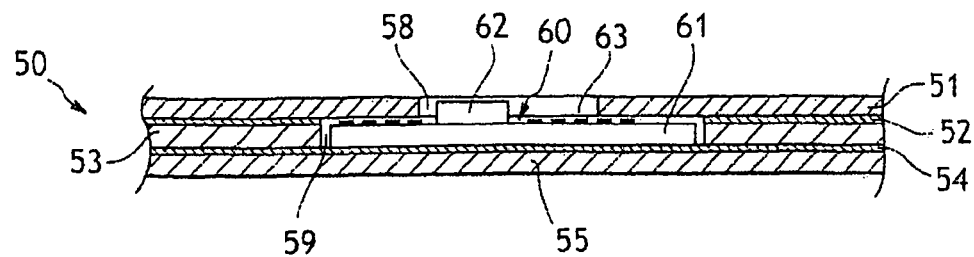
FIG.11
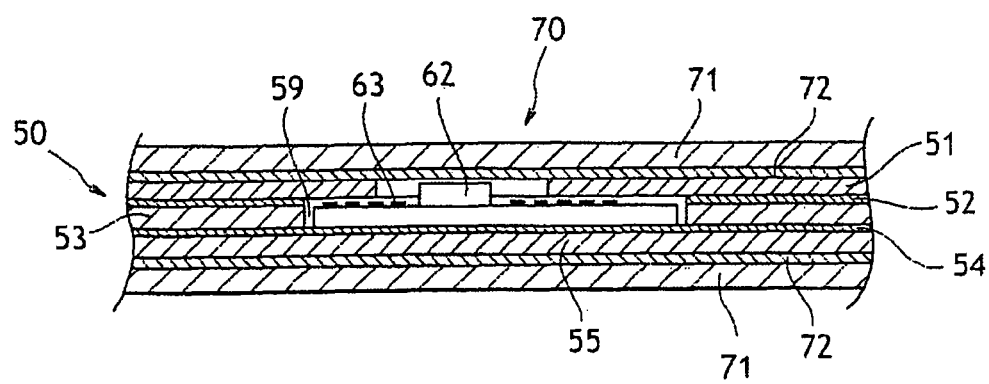
FIG.12
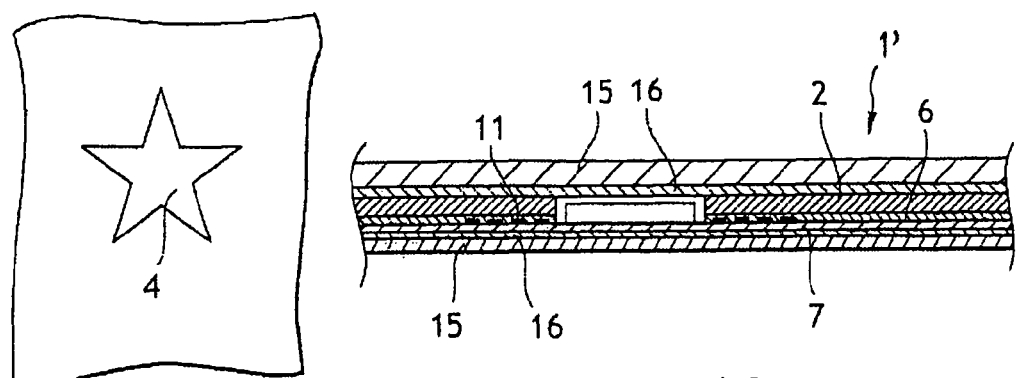
FIG.13
FIG.16

STRUCTURE INCLUDING AN ELECTRONIC DEVICE FOR MAKING A SECURITY DOCUMENT

The present invention relates to a structure including an electronic device, in particular for making a security document and/or a document of value or for making an article secure.

The term "making an article secure" is used to mean providing an article, e.g. a packaging device, with an electronic device capable of performing an anti-theft function, or of constituting authentication means or tracing means, for example.

Patent application GB 2 279 907 discloses a smart card made by assembling together bottom and top layers with a central structure carrying an electronic device, which device comprises an integrated circuit and a coil connected to the circuit. To make the central structure, the electronic device is sandwiched between two polyester layers, each covered on one face with a thermally activatable adhesive. The central structure is itself sandwiched between bottom and top layers of polyvinyl chloride (PVC). The layers constituting the central structure are assembled with the electronic device and the central structure is assembled with the bottom and top layers when the card is made. Under the action of pressure and temperature, the electronic device is pressed into the adjacent layers, thus serving to compensate for its thickness, and also bonding the various layers together. That patent application does not describe a preassembled central structure.

U.S. Pat. No. 6,305,609 discloses a smart card made by assembling bottom and top layers with a central structure carrying an electronic device. The central structure comprises a support film carrying the electronic device, which device comprises an integrated circuit and a coil connected to the circuit. The device projects from both sides of the support film. The projecting portions are compensated in thickness by a liquid thermoplastic that is cross-linked under ultraviolet (UV) radiation. The liquid is inserted at the last moment during assembly of the central structure with the above-mentioned bottom and top layers. Those layers together with the support film are made of thermoplastic material. That type of central structure presenting portions of extra thickness requires special equipment for its final assembly in the card, or between bottom and top layers that are of a fibrous nature, for example.

U.S. Pat. No. 6,233,818 discloses a smart card made by assembling bottom and top layers with a central structure carrying an electronic device. The central structure includes a support film of thermoplastic material with a window in which the electronic device is placed, which device comprises a module with an integrated circuit and a copper coil that is connected to the circuit and inserted at the surface of the film using an ultrasound method. The film is made of PVC, polycarbonate (PC), or cyclohexanedimethanol-modified polyethylene terephthalate (PET-G), and is subsequently directly suitable for being laminated with printed bottom and top layers to make the smart card by using specific equipment that generates both pressure and temperature.

Such a structure is difficult to manipulate since the antenna is flush with the structure.

In addition, that type of structure is not adapted to being directly integrated between the cover of a passport and the booklet of sheets, for example, since the binding adhesives presently in use are applied cold and in liquid form.

European patent EP 1 010 155 discloses a security label including an anti-theft device within it.

Patent application WO 00/42569 discloses a label made by depositing the following layers in succession on a silicone-covered paper:
 a layer of adhesive that can be cross-linked under the effect of UV radiation;
 a layer of an electrically conductive material forming connection tabs;
 a layer of dielectric material;
 a layer of a conductive metallic ink for forming an antenna; and
 an expandable layer containing a polymeric resin and including a window.

An electronic device is inserted in the window of the expandable layer, in contact with the antenna. An encapsulating resin is deposited in the window. In that application, there is no preassembled central structure. The expandable layer includes a gap in register with the chip in order to avoid any extra thickness. With a label made in that way, it is also relatively easy to peel the label from its support after it has been applied thereto, and to do so without leaving evidence of falsification. Finally, such a structure does not enable the electronic device, i.e. the chip and its antenna, to be camouflaged when the label is viewed in transmitted light.

The supplier SMARTRAC sells structures known as "Prelaminated Inlays" comprising layers of polycarbonate or PET that are designed to be integrated in a security document. The supplier AONTEC also sells structures known as "Prelaminated Inlays" that are designed to be laminated with layers of a security document, those structures comprising layers of PVC or PC.

Those structures are not completely satisfactory in terms of security and assembly with bottom and top layers that are fibrous.

In one of its aspects, the invention seeks in particular to propose a structure including an electronic device that makes any attempt at falsifying an article or a security document or document of value including such a structure more difficult or even impossible, and that is easy to assemble with the article or the remainder of the document.

In one of its aspects, the invention provides a method of making a structure for making a security document and/or a document of value, or for making an article secure, the structure comprising at least one electronic device and at least one at least partially fibrous layer having a window arranged to receive the electronic device, at least in part, the method comprising the following steps:
 placing at least part of the electronic device in the window in the layer; and then
 depositing a resin in the window so as to encapsulate the electronic device, at least in part.

The term "electronic device" is used to mean any device enabling information to be stored and/or exchanged, in particular via a wireless link. The electronic device may be a radiofrequency identification (RFID) device, in particular. The electronic device may include an antenna, e.g. in the form of a coil made of wire or printed.

The electronic device may include an electronic chip of the flip-chip type. In known manner, such a chip has contact tabs or "bumps" that can be placed on conductive tracks of a support or substrate to which the chip is secured.

By means of the invention, the electronic device can be put into place in the above-mentioned window, without any encapsulating resin, thus enabling the electronic device to be put in the window more simply, in particular without any need to flatten the layer of the structure since the electronic device can present dimensions that are smaller than it would present if it were already provided with encapsulating resin. Furthermore, positioning the electronic device relative to the corresponding window of the layer is made easier when the dimensions of the electronic device are small enough relative to those of the window in the layer. Furthermore, since the layer of the structure is fibrous, at least in part, it can be spoilt in the event of an attempt being made to separate the electronic device from said layer, the encapsulating resin providing sufficient anchoring of the electronic device within the layer. This reinforces protection of the structure against an attempt at falsification.

Preferably, the layer contains paper-making fibers, e.g. cellulose fibers and/or fibers of a synthetic nature. The above-mentioned layer may be used as an intermediate layer suitable for being sandwiched between two adjacent layers of the structure.

Advantageously, the resin is a thermosetting resin, e.g. an epoxy resin.

In an embodiment of the invention, the resin is deposited, preferably cast, in the window while it is in the liquid or viscous state, the resin possibly filling the window in the layer completely.

The electronic device may include electronic chip of the flip-chip type, and where appropriate a support made of glass epoxy carrying the electronic chip, for example. The electronic chip is preferably secured to the support before being assembled with the layer of the structure. When the chip is of the flip-chip type, its contact tabs or "bumps" are preferably soldered to the conductive tracks of the support.

The electronic device may include an antenna, in particular a wire antenna.

When the support includes at least one conducive track electrically connected to the electronic chip, the antenna may be connected to the conductive track, in particular by soldering, before the support is assembled with the layer of the structure.

In a variant, the antenna is fastened on a layer of the structure, in particular a fibrous layer, prior to being connected electrically to the electronic chip.

The electronic device may present thickness that is less than 500 micrometers ($\mu m$), in particular less than 250 $\mu m$, and/or an area that is greater than 1 square millimeter ($mm^2$), in particular greater than 4 $mm^2$.

Independently or in combination with the above, the invention also provides a structure intended in particular for use in making a security document and/or a document of value, or for making an article secure, the structure comprising:
   an electronic device;
   a layer, preferably an at least partially fibrous layer, e.g. a layer that is completely fibrous, having a window in which the electronic device extends, at least in part; and
   a resin encapsulating the device and adhering to said layer, in particular because the resin is deposited in the window only after the electronic device has been placed in the window in the layer.

The invention thus provides better anchoring of the device within the structure because of the adhesion between the layer and the encapsulating resin.

Advantageously, the encapsulating resin presents adhesive power and cohesion that are strong enough to ensure that any attempt at separating the electronic device from said layer spoils at least said layer.

In an embodiment of the invention, the electronic device includes a flip-chip type chip, and the encapsulating resin may coat the electrical contact tabs or "bumps" of the chip, at least in part, in order to protect them, in particular from mechanical impacts.

The encapsulating resin is preferably a thermosetting resin, in particular an epoxy resin.

In a variant, the resin may be a hot-melt resin, for example.

In an embodiment of the invention, the structure includes an adhesive layer in contact with said layer, e.g. a layer of a hot-melt adhesive.

The structure may include an adjacent layer assembled with the above-mentioned layer via the adhesive layer, the adhesive having adhesive power and cohesion that are strong enough for any attempt at separating the two layers to spoil at least one of them.

The adjacent layer may be one of: a layer including a window; a masking layer; and a support of the electronic device.

In an embodiment of the invention, the structure includes a removable anti-adhesion film for protecting the layer of adhesive.

The structure may include at least one outer fiber layer for assembly with a fiber layer of the security document and/or document of value.

Independently or in combination with the above, the invention also provides a structure, in particular intended for making a security document or document of value, or for making an article secure, the structure comprising:
   an electronic device;
   an at least partially fibrous intermediate layer having a window in which the electronic device extends, at least in part; and
   a layer of adhesive in contact with the intermediate layer. The layer of adhesive can serve, for example, to assemble the intermediate layer with an adjacent layer of the structure or with an adjacent layer of a security document or document of value in which the structure is integrated, or it may serve to secure the structure on an article.

Preferably, the adhesive presents adhesive power and cohesion that are strong enough to ensure that any attempt at separating the intermediate layer from the above-mentioned adjacent layer spoils at least the intermediate layer.

By way of example, the structure of the invention can be used for making an identity document, e.g. a passport, or a visa label.

By means of the invention, the structure need not present any perceptible extra thickness if so desired, since the electronic device can be received entirely within the window of the intermediate layer. Thus, the structure can easily be assembled, at will, with various types of security document, without it being necessary to have a specific element for compensating for the thickness of the electronic device, as is necessary for example with the smart card described in above-specified U.S. Pat. No. 6,305,609.

The structure of the invention also presents the advantage that an attempt at falsifying it is relatively difficult or even impossible since the intermediate layer is easily spoilt in the event of an attempt at peeling the structure apart, which need not necessarily be the case for a security document or document of value made with a central structure of the kind described for example in U.S. Pat. No. 6,233,818 or in patent application WO 00/42569.

In addition, the fact that the electronic device is housed at least in part in a window of the intermediate layer means that the electronic device is protected against mechanical impacts.

The above-mentioned adjacent layer may be constituted, for example, by one of: an additional intermediate layer; a masking layer; and a support of the electronic device; this list not being limiting.

When the structure is for making a label, e.g. a visa label, the above-mentioned adhesive layer is advantageously covered in a removable, protective, anti-adhesion film.

In a particular embodiment, the structure includes at least one outer fiber layer for assembling with a fiber layer of the security document or document of value.

Thus, the structure can be assembled with at least one fiber layer of the security document or document of value in a manner that is relatively easy, in particular without using a special adhesive and without implementing special lamination conditions such as those commonly encountered in the manufacture of smart cards (lamination time of 30 minutes (min) at 150° C.), and while limiting problems of curling since the fiber layers of the structure and of the document that are to be assembled together are similar or compatible in nature.

Advantageously, the intermediate layer is entirely fibrous, which can make it easier, for example, to incorporate security elements therein and which can also make it easier for it to be spoilt in the event of an attempt at falsification.

In an embodiment of the invention, at least one of the nature and the thickness of the intermediate layer is selected in such a manner that the intermediate layer is opaque in transmitted light. Thus, the intermediate layer can serve to mask the electronic device, at least in part, when the structure is observed in transmitted light.

The intermediate layer may also be arranged to reflect light, thus also serving to mask the electronic device, at least in part, when the structure is observed in reflected light or in transmitted light.

The intermediate layer may be white, or in a variant it may be colored. The intermediate layer may comprise a colored core with a white coating.

When the intermediate layer is colored, the dye(s) and/or pigment(s) present in the intermediate layer is/are preferably retained in the intermediate layer sufficiently strongly to avoid migration of the dye(s) or pigment(s) into the adjacent layers of the structure and/or the security document or document of value on which the structure is assembled.

The intermediate layer may be metallized or laminated with at least one metallic film, which may serve to make it opaque.

The window preferably passes through the intermediate layer, but in a variant the window need not be a through window.

In an embodiment of the invention, the structure is arranged so as to enable a security element carried by the structure to be detected on the security document or document of value through the window of the intermediate layer, either visually, possibly under special lighting, or with the help of a detector device, the security element possibly being present on the electronic device, e.g. in the form of an inscription or a coating such as a varnish, for example. By way of example, the structure may include a thermochromic coating that is detectable on the security document or document of value through the window.

Preferably, the structure in particular of at least one of: the intermediate layer; an optional masking layer; and the adhesive layer, includes at least one of the following security elements: an authentication element; and an element for revealing falsification; said security element(s) being visible and/or detectable with the help of a detector device.

The structure, in particular at least one of: the intermediate layer; an optional masking layer of the structure; and the adhesive layer, advantageously includes at least one security element selected from: an element providing a variable and/or diffractive optical effect, such as, for example: a holographic, iridescent, or liquid crystal element; a magnetic or crystalline coating; magnetic fibers; tracers detectable by magnetic resonance; tracers detectable by X-ray fluorescence; printing using a varnish or an ink; luminescent or fluorescent tracers; photochromic, thermochromic, electroluminescent, and/or piezochromic compounds; and/or compounds that change color in contact with one or more predetermined substances, in particular acids, bases, or oxidizers, or solvents.

Advantageously, the window and/or the intermediate layer presents a shape that imitates an image, a logo, or an inscription, so as to define additional security for the structure and the document fitted with the structure. The window thus need not be rectangular, for example.

In an embodiment of the invention, the electronic device comprises a support carrying an electronic chip and an antenna connected to the electronic chip, the electronic chip extending at least in part in the window of the intermediate layer. The antenna serves to deliver an electrical power supply to the electronic chip and to read and/or write data in the chip, without making contact. The chip may comprise one or more integrated circuits, and in particular a memory.

The support may be flexible. The support may be made of a material that is inorganic or organic, natural or synthetic, e.g. a fiber layer, in particular a layer of paper.

By way of example, the support may also be made of a material containing a polymer, in particular PET. In a variant, the support may be made of PVC, acrylonitrile-butadiene-styrene and polycarbonate blend (ABS/PC), or PC, this list not being limiting.

The electronic chip fastened on the support may optionally include an encapsulating resin. The antenna may be of the wire type or it may be etched, printed, or made by stamping, or indeed with the help of an electrolytic growth method. The antenna may extend at least in part on the chip. When the antenna is a wire antenna, it is advantageously held by a layer of adhesive, which can serve to assemble together two layers of the structure. The adhesive layer then advantageously presents thickness that is greater than the thickness of the antenna wire.

On one face, the support may include a coating containing a security element, such as for example an irreversible thermochromic compound that changes color, e.g. that goes form being colorless to having a predefined color, e.g. red or pink, when the temperature exceeds a predefined value, e.g. about 65° C. This can serve to reveal a thermal attack on the structure.

In an embodiment of the invention, the support is sandwiched between two layers of the structure. Under such circumstances, the structure may have a single intermediate layer.

In a variant, the structure may have at least one additional intermediate layer in which the support of the electronic device is housed, at least in part. This device may comprise a module having a connection portion for connection to an antenna, and an electronic chip, in particular of the flip-chip type, embedded in an encapsulating resin.

The additional intermediate layer may include a window housing the connection portion of the module, at least in part, the encapsulating resin being received in the window of the other intermediate layer. The antenna of the electronic device may be carried by said additional intermediate layer, where appropriate.

When the structure has a plurality of intermediate layers each with its own window, the various windows may be of different dimensions, e.g. for the purpose of adapting to the shape of the electronic device. This can serve to reinforce protection of the device against impacts.

When the structure has two intermediate layers, one of them includes a window that is smaller than the window in the other layer.

In a variant, the windows in both layers may be identical in size.

The structure may present a maximum thickness of about 500 μm for example.

In an embodiment of the invention, the structure includes at least one masking layer disposed at least in register with a window of an intermediate layer, so as to mask the electronic device, at least in part, when the structure is observed in transmitted light and/or in reflected light. Thus, the structure may present increased security against counterfeiting, making any attempt at reproducing the structure more difficult.

The masking layer may be white or colored. The masking layer may comprise a colored core with a white coating.

The masking layer may be metallized or it may be laminated with at least one metallic film.

The masking layer may be an optionally-fibrous layer.

In an embodiment of the invention, the adhesive layer is selected to enable the intermediate layer to be assembled hot or cold with the adjacent layer of the structure. The adhesive layer may comprise a hot-melt adhesive, for example.

The adhesive layer may be colored so as to mask the electronic device, at least in part, when the structure is observed in transmitted and/or reflected light.

Adhesion between two adjacent layers of the structure is preferably stronger than the internal cohesion of at least one of said layers. The internal cohesion of a layer corresponds in particular to its ability to withstand internal delamination. Thus, an attempt at separating one of the layers from the structure causes the layer to be spoilt.

In an embodiment of the invention, the structure has two intermediate layers, one of them presenting internal cohesion that is weaker than that of the other intermediate layer.

The intermediate layer advantageously presents internal cohesion that is weaker than or equal to that of the masking layer, if present.

When the electronic device includes a support, the internal cohesion of the support may be weaker than or equal to that of the intermediate layer. Thus, the structure provides security against an attempt at falsification by tearing or delaminating between the intermediate layer and the masking layer, or between the intermediate layer and the support, in particular if the support presents the same dimensions as the intermediate layer, in an attempt to isolate the electronic device.

The structure may include an anti-adhesion film for removal when the structure is to be stuck onto a document or an article, such as packaging, for example.

The structure may be coated on its two opposite faces in layers of adhesive. Each adhesive layer may be protected by a removable, protective anti-adhesion film, in particular when the adhesive is sensitive to pressure. When the adhesive is not sensitive to pressure, e.g. being thermally activatable, an anti-adhesion film need not be necessary.

In particular when it includes an anti-adhesion film protecting the adhesive layer, the structure may constitute a visa for sticking on a sheet of a passport.

The structure may include a security element that is visible on its edge.

In another of its aspects, independently or in combination with the above, the invention provides a structure intended in particular for making a security document or document of value, or for making an article secure, the structure comprising:
an electronic device; and
a layer, in particular a fiber layer, having a window in which the electronic device extends, at least in part, the window presenting a shape other than a rectangular shape, in particular a shape imitating an image, a logo, or an inscription, e.g. at least one letter or digit. This layer may be an intermediate layer as defined above.

In another of its aspects, independently or in combination with the above, the invention also provides a structure, in particular a structure for making a security document or document of value, or for making an article secure, the structure comprising:
an electronic device;
an intermediate layer with a window in which the electronic device extends, at least in part; and
an adhesive layer in contact with the intermediate layer, e.g. enabling the device to be assembled with an adjacent layer of the structure or with a security document or document of value;
at least one of the intermediate layer and the adhesive layer including at least one security element arranged so that a signal visible under predetermined illumination or detectable by an appropriate detector system, which may be optical or otherwise, becomes modified in the event of the intermediate layer or the adhesive layer being spoilt, in particular by being torn, delaminated, or attacked chemically or thermally.

Independently or in combination with the above, the invention also provides a structure, in particular for making a security document or document of value or for making an article secure, the structure comprising:
an electronic device;
a support for the electronic device, the support being of fibrous or inorganic nature; and
a layer, in particular a fibrous layer, having a window in which the electronic device extends at least in part. In particular, the support may include a thermochromic security element that is capable of changing color in irreversible manner in the event of a thermal attack.

Independently or in combination with the above, the invention also provides a structure, in particular for a security document or document of value, the structure comprising:
an electronic device;
an intermediate layer with a window in which the electronic device extends, at least in part; and
an adhesive layer in contact with the intermediate layer, e.g. enabling the device to be assembled with an adjacent layer of the structure or of a document; the structure including at least one security element arranged to be detectable, in particular visually, in the edge of the structure.

Independently or in combination with the above, the invention also provides a structure for use in making a security document or document of value, or for making an article secure, the structure comprising:
an electronic device;
a first intermediate layer including a window in which the electronic device extends, at least in part;
an adhesive layer; and
a second intermediate layer including a window in which the electronic device extends, at least in part; the adhesive layer serving to hold the two intermediate layers and an antenna of the electronic device.

Independently or in combination with the above, the invention also provides a structure for use in making a security document or document of value, or for making an article secure, the structure comprising:
an electronic device;
an intermediate layer including a window in which the electronic device extends, at least in part; and
a masking layer preventing the electronic device from being seen therethrough.

The invention also provides a security document or document of value including a structure as defined above or constituted by such a structure, as can apply in particular when the document is a visa.

The security document may constitute an identity document, a visa label, or a passport booklet, in particular a flyleaf or a cover for a passport, this list not being limiting. The document of value may constitute payment means.

The document may include a receiver layer for assembly with the structure, with the internal cohesion of the receiver layer preferably being stronger than that of the intermediate layer of the structure and possibly than that of the masking layer of the structure for assembly with the receiver layer of the document.

Advantageously, adhesion between the receiver layer of the document and the intermediate layer or the optional masking layer is stronger than the internal cohesion of the intermediate layer or the optional masking layer.

A structure of the invention, in particular a preassembled structure, can be designed to be sandwiched between two fiber layers, in particular to sheets of paper.

According to another of its aspects, independently or in combination with the above, the invention also provides a security document or document of value, comprising:
  a structure comprising:
    an electronic device;
    an intermediate layer with a window in which the electronic device extends, at least in part;
  at least one first security element that is visible in daylight, in transmission or in reflection, said first security element being defined, for example, by the shape of the window in the intermediate layer of the structure;
  at least one second security element that is visible under lighting other than daylight, said second security element being visible, for example, under UV or infrared (IR) illumination; and
  at least one third security element that is detectable by a non-optical device, e.g. an electromagnetic device, e.g. a device for detection by magnetic resonance or by X-ray fluorescence.

According to another of its aspects, independently or in combination with the above, the invention also provides a security document or document of value, comprising:
  a structure comprising:
    an electronic device;
    an intermediate layer with a window in which the electronic device extends, at least in part;
  at least two fiber layers between which the above-mentioned structure is interposed.

The above-mentioned structure may include a security element that remains visible at the edge of the document after the various layers thereof have been assembled together.

According to another of its aspects, independently or in combination with the above, the invention also provides a security document or document of value, comprising:
  a structure comprising:
    an electronic device;
    an intermediate layer with a window in which the electronic device extends, at least in part;
  a layer with which the above structure is assembled, the structure extending over the major fraction of said layer, and in particular over its entire area.

Independently or in combination with the above, the invention also provides a passport comprising:
  a structure comprising:
    an electronic device;
    an intermediate layer with a window in which the electronic device extends, at least in part; and
    an adhesive layer covering the intermediate layer; and
  a stitching thread passing through the structure and at least one sheet of the passport, in particular a sheet stuck to the cover of the passport.

Independently or in combination with the above, the invention also provides a method of making a structure for use in making a security document or document of value, or for being fitted to a security document, the method comprising the following steps:
  providing an electronic device;
  providing an intermediate layer with a window, preferably a through window;
  depositing an adhesive layer on the intermediate layer, enabling the intermediate layer to be assembled with an adjacent layer of the structure, the adhesive having adhesive power and cohesion that are sufficiently strong to ensure that an attempt at separating the intermediate layer from the adjacent layer spoils the intermediate layer; and
  placing the electronic device, at least in part, in the window of the intermediate layer.

The method may include the following steps:
  depositing the adhesive layer on the intermediate layer; and
  making a window, preferably a through window, in the assembly constituted by the intermediate layer and the adhesive layer, and in particular doing so with the help of a punch or a laser.

The method may also include the following steps:
  providing an adhesive layer in the form of a film that is to be transferred, said adhesive layer initially being covered by at least one anti-adhesion film;
  withdrawing the anti-adhesion film from the adhesive layer; and
  assembling the adhesive layer with the intermediate layer.

In a variant, the method includes the following steps:
  depositing an adhesive in liquid form on the intermediate layer or on an optional masking layer so as to form an adhesive layer; and
  optionally covering the adhesive layer as formed in this way with an anti-adhesion film.

When the structure includes two intermediate layers, the method may include the following step:
  separately making at least one window, and preferably a through window, in each of the intermediate layers.

The method may include the following steps:
  deposing a layer of adhesive on each of the intermediate layers; and
  cold or hot laminating the various layers of the structure together.

The invention also provides a method of making a security document or document of value, it comprises the following steps:
  forming a structure as defined above, the structure being preassembled; and
  assembling said structure with the security document or document of value.

The method may include the following step:
  cold or hot laminating the structure with a layer of the security document or document of value.

The method may include the following steps:
  depositing an adhesive film on the structure and/or a layer of the security document or document of value; and
  assembling the structure with the security document or document of value with the help of the adhesive layer.

In a variant, the method may include the following steps:
  treating the outside surface of the structure in such a manner as to make it adhesive and optionally covering it in temporary manner with an anti-adhesion film; and
  assembling the structure with the security document or document of value by putting the treated face of the structure into contact with the document.

The method may include the following step:
  stitching the structure with at least one sheet or one layer of the security document or document of value.

Advantageously, the stitching is performed through a support for the electronic device of the structure, away from an antenna and an electronic chip.

The method may include the following steps:
  printing or depositing a security element on a layer of the document prior to assembly with the structure; and
  assembling the structure with said layer of the document.

Thus, the structure is incorporated in the document only once the layer(s) of the document is/are properly printed or the security element is properly fitted.

In a variant, the method may include the following steps:
  assembling the structure with a layer of the document; and
  then printing or depositing a security element on the layer of the document.

The invention can be better understood on reading the following detailed description of non-limiting embodiments thereof, and on examining the accompanying drawings, in which:

FIG. 11 is a diagrammatic and fragmentary cross-section view of a structure in accordance with another embodiment of the invention;

FIG. 12 is a diagrammatic and fragmentary cross-section view of a security document or document of value with the FIG. 11 structure;

FIG. 13 is a diagrammatic and fragmentary view of a window in an intermediate layer in accordance with the invention;

FIG. 16 is a diagrammatic and fragmentary cross-section view of a structure in accordance with another embodiment of the invention;

Figure 1:
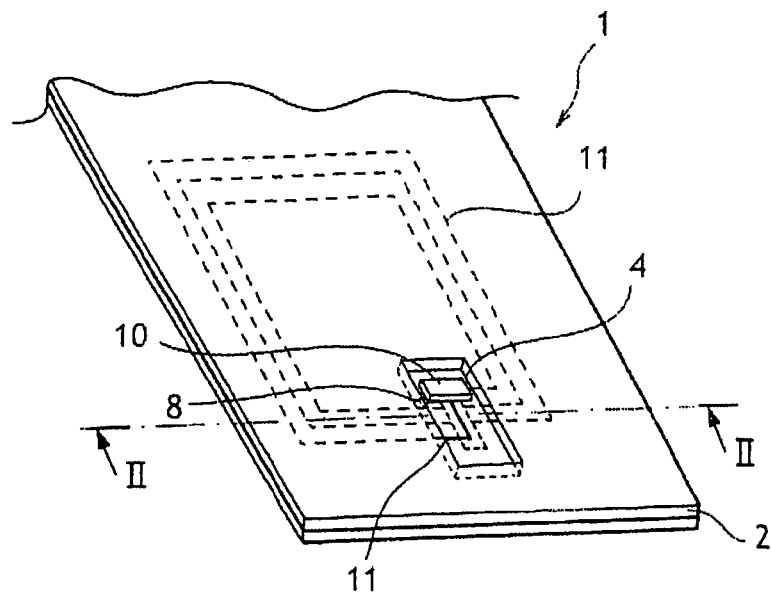
FIG. 1 is a diagrammatic and fragmentary view of a structure in accordance with an embodiment of the invention.

In the drawings, the relative proportions of the various elements shown are not always complied with, for reasons of clarity.

EXAMPLES OF STRUCTURES

Example 1

FIG. 1 shows a structure 1 in accordance with the invention for use in making a security document or document of value.

The structure 1 comprises an intermediate layer 2 having a through orifice defining a window 4.

In the example described, the window 4 is rectangular in shape, however it would not go beyond the ambit of the present invention for the window 4 to present some other shape, e.g. having the shape of a star, as shown in FIG. 13. In general, the window 4 may present a shape that imitates an image, a logo, or an inscription.

In the example described, the intermediate layer 2 is a fibrous layer, in particular a layer of paper, for example having density of about 215 grams per square meter ($g/m^2$) and a thickness of 280 (μm).

The intermediate layer 2 may incorporate a dye, e.g. of the sulfur black type giving it a black color, the dye presenting satisfactory fixing in the intermediate layer 2, so as to avoid any migration of the dye to other layers when the intermediate layer 2 is in contact with an adhesive and/or is subjected to a high temperature and/or to a humid atmosphere.

In the example described, the intermediate layer 2 is opaque in transmitted light and may include a security element that is visually detectable, possibly under predetermined lighting, e.g. ultraviolet (UV) or infrared (IR), or in a variant using a predetermined detector device, e.g. for detecting magnetism.

In the example described, the intermediate layer 2 includes tracers that are detectable with an appropriate detector device, e.g. tracers sold by the supplier Microtag, which tracers are detectable by magnetic resonance.

The intermediate layer 2 may present cohesion having a value of about 150 Scott units, and measured using the Scott Bond apparatus.

The intermediate layer 2 may include any other security element such as, for example: an element having an optical effect that is variable and/or diffractive, such as, for example a holographic, iridescent, or liquid crystal element; a magnetic or crystal line coating; magnetic fibers; tracers detectable by magnetic resonance; tracers detectable by X-ray fluorescence; printing using varnish or ink; luminescent or fluorescent tracers; photochromic, thermochromic, electroluminescent, and/or piezochromic compounds, and/or compounds that change color in contact with one or more predetermined substances.

Figure 2:
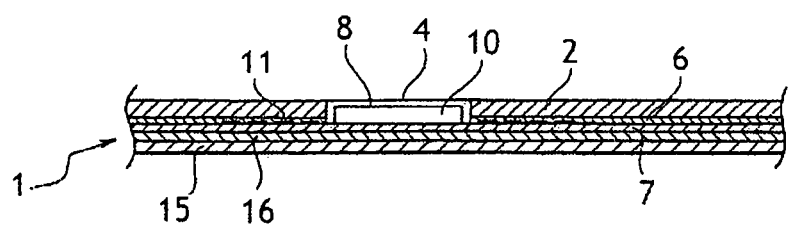
FIG. 2 is a diagrammatic and fragmentary cross-section view on II-II showing the FIG. 1 structure.

As shown in FIG. 2, an adhesive layer 6 is deposited on the bottom face of the intermediate layer 2 so as to enable it to be assembled with a support 7 supporting a contactless type electronics device 8.

In general, the thickness of the intermediate layer is greater than or equal to the thickness of the bare or encapsulated chip or a portion of a module including the chip, as the case may be. The size of the window is greater than or equal to the size of the bare or encapsulated chip or of a portion of the module including the chip, as the case may be.

In the example described, the adhesive 6 is an adhesive that is sensitive to pressure. In a variant, the adhesive 6 may be of any other type, e.g. an adhesive that is sensitive to heat.

In the example described, the adhesive layer 6 contains a permanent adhesive including a solvent, for example of the acrylic kind, and it presents a thickness of about 25 µm.

The adhesive layer 6 is initially in the form of a transfer film and it is cold-laminated on the intermediate layer 2.

The adhesive power and the cohesion of the adhesive layer 6 are greater than the internal cohesion of the intermediate layer 2.

In addition to the support 7, the electronic device 8 includes an electronic chip 10.

In the example described, the chip 10 is a chip sold under the name Picotag 16 KS by the supplier Inside and it is square in shape, having a section of about 4 mm$^2$ and a thickness of about 200 µm.

The chip 10 is connected to an antenna 11 which is made of aluminum and etched on the support 7. The support comprises a film made of transparent polyethylene terephthalate (PET) having a thickness of about 40 µm.

The chip 10 may be based on silicon, or in a variant on a polymer.

On one of its faces, the support 7 has a coating or keying primer containing an irreversible thermochromic compound that changes color when the temperature exceeds 65° C., e.g. going from colorless to reddish pink.

The structure 1 includes an anti-adhesion film 15 fixed on the support 7 via a layer of adhesive 16. This layer is identical to the adhesive layer 6. The anti-adhesion film 15 is designed to be removed before the structure is assembled on a document or an article.

There follows a description in greater detail of the steps for making the structure 1.

Initially, the adhesive layer 6 secured to an anti-adhesion film (not shown) is cold-laminated on the bottom face of the intermediate layer 2.

An opening is made through the assembly constituted by the intermediate layer 2, the adhesive layer 6, and the anti-adhesion film, using a cutter machine having a punch, the opening being designed to form the window 4 in the structure 1.

The anti-adhesion film is then separated.

The intermediate layer 2 together with the adhesive layer 6 on top, the support 7 with the antenna 11 on top, the adhesive layer 16, and the anti-adhesion film 15 are assembled together by cold-laminating on a specific machine, with the chip 8 being received in the window 4 without extending therebeyond, as can be seen in FIGS. 1 and 2.

The structure 1 as obtained in this way can be used for making a security document.

Example 2

Figure 3:
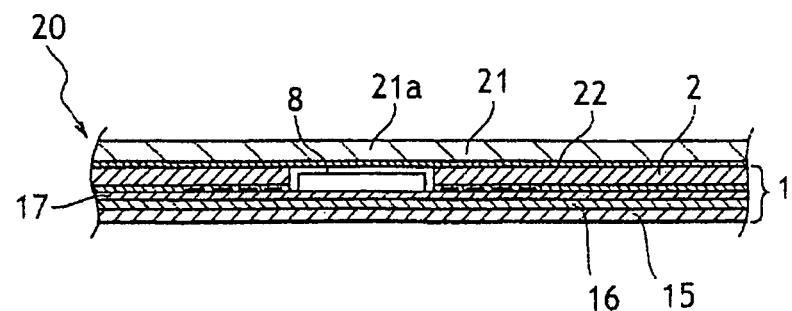
FIG. 3 is a diagrammatic and fragmentary cross-section view of a security document or document of value assembled with the FIG. 2 structure.

FIG. 3 shows a document 20 such as a visa label, comprising a fiber layer 21 of paper, said layer 21 being cold-laminated onto the top face of the structure 1 via an adhesive layer 22 that is sensitive to pressure.

The document 20 may also receive a security element, e.g. a holographic patch, an ink that reacts with apolar solvents, or an irreversible thermochromic ink that changes color when the temperature reaches 65° C., these security elements preferably being implemented away from the portion 21a of the layer 21 situated in register with the window 4 of the structure 1.

The fiber layer 21 may include other security elements such as fluorescent colored visible security fibers, invisible fluorescent flakes for authentication purposes, and chemical reagents such as reagents that react with acids, bases, oxidizers, and polar solvents in order to counter any attempt at falsification using chemicals.

The document 20 can thus present the following advantages:

security in terms of authentication:
first level security: visible fibers, window, e.g. in the form of a star that is visible in transmitted light;
second level security: fluorescent fibers and flakes that are detectable under UV illumination at a wavelength of 365 nanometers (nm); and
third level security: Microtag security detectable using a detector device;
security in terms of protection against falsification:
against chemical attack: reagents in the paper producing a colored spot that is visible at the surface of the label in the event of chemical attack. Such chemical attacks may occur during an attempt at erasing inscriptions present on the printed surface of the visa, or during attempts at removing a visa applied to a passport, or indeed during attempts at opening the visa in order to recover the electronic device;
against thermal attacks: attempts at removing the visa together with the electronic device after it has been applied to passport paper (peeling initiated between the passport and the intermediate layer) leading to a change in the color of the thermochromic compound in the support of the electronic device, this change in color being visible in reflection and above all in transmission through the window 4 of the intermediate layer 2, attempts at recovering the printed security paper (peeling between the security paper and the intermediate layer) leading to the appearance of a colored pattern produced by the printing using a thermochromic ink on the surface of the security paper, making any fraudulent use awkward; and
against mechanical attacks, without applying high temperature: attempts at removing the visa together with the electronic device after it has been applied to passport paper (peeling initiated between the passport and the intermediate layer) leading to the intermediate layer delaminating so that a portion of it remains on the passport paper while the remainder remains on the label, thus making it difficult to reuse the visa in full. Nevertheless, if the label is stuck on another passport, during inspection there will in any event a loss of detection signal from the Microtag tracers since a portion of the intermediate layer is missing from the label. Attempts at recovering the printed security paper alone (peeling between the security paper and the intermediate layer) lead to delamination of the intermediate layer or of the visa. If the intermediate layer is delaminated, the pattern visible in transmission through the window is very likely to be degraded, thereby revealing falsification.

Furthermore, the electronic device 8 is not visible in transmitted light away from the window 4, thus improving the appearance of the document 20 and of the patterns printed thereon.

The structure may present some other shape.

Example 3

FIG. 16 shows a structure 1' that differs from the above-described structure 1 by the fact that it includes an adhesive layer 16 on each of the faces of the intermediate layer 2. Each adhesive layer 16 is covered in an anti-adhesion film 15 that can be removed during assembly of the structure 1' on a document or an article.

Example 4

Figure 4:
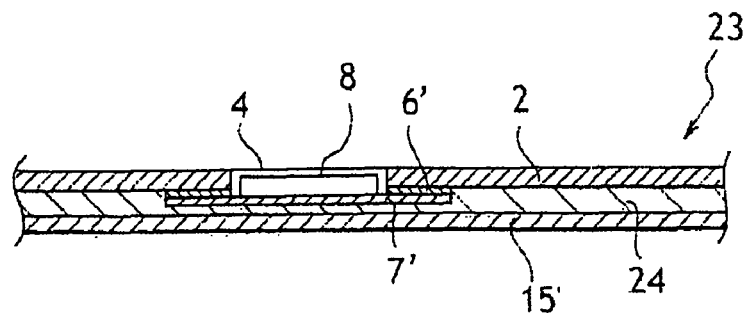
FIG. 4 is a diagrammatic and fragmentary cross-section view of a structure in accordance with another embodiment of the invention.

FIG. 4 shows a structure 23 for use in making a security document in accordance with another embodiment of the invention.

The structure 23 comprises:

an intermediate layer 2 as described above;

an adhesive layer 6' extending only around the window 4 of the intermediate layer 2, and not over the entire face of said intermediate layer 2;

a support 7' for supporting the electronic device 8, the support 7' extending over only a portion of the intermediate layer 2, in register with the adhesive layer 6';

an adhesive layer 24 extending over the entire bottom face of the intermediate layer 2; and a masking layer 15'.

Figure 5:
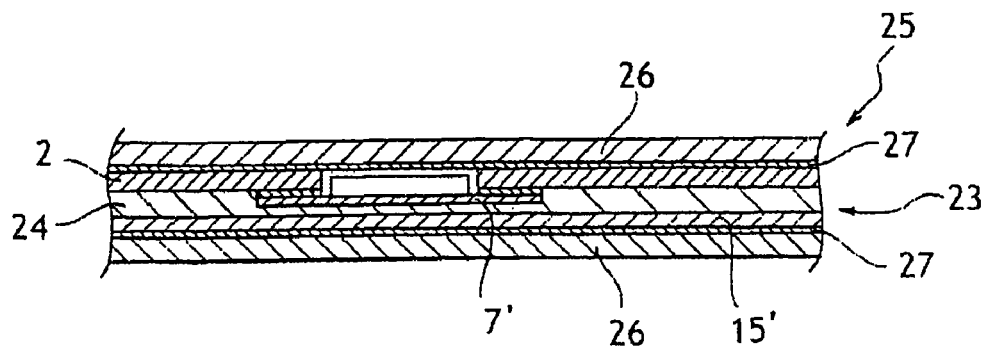
FIGS. 5 and 6 are diagrammatic and fragmentary cross-section views of two security documents or documents of value assembled with the FIG. 4 structure.

The structure 23 can be incorporated in a security document 25 as shown in FIG. 5, being laminated between two layers of paper 26 via the two adhesive layers 27. These layers may comprise adhesive that is sensitive to heat.

In the example described, the intermediate layer 2 presents internal cohesion that is weaker than or equal to the cohesion of the layer of paper 26 on which the layer 2 is assembled. Thus, any attempt at unsticking the layer of paper is liable to cause the intermediate layer 2 to become delaminated.

Still in the example described, the masking layer 15' presents internal cohesion that is weaker than or equal to that of the adjacent layer of paper 26. The adhesion between the intermediate layer 2 and the masking layer 15', between the intermediate layer 2 and the adjacent layer 26, and between the masking layer 15' and the adjacent paper layer 26 is stronger than the cohesion of the intermediate layer 2 and stronger than that of the masking layer 15'. The intermediate layer 2 and the masking layer 15' present similar cohesion. The adhesive layer 24 presents adhesive power and cohesion that are stronger than the cohesion of the intermediate layer 2 and than the cohesion of the masking layer 15'.

This prevents an attempt at falsifying the document 25 by tearing or delaminating the intermediate layer 2 or the masking layer 15' in order to remove the electronic device 8.

Security against falsification is reinforced when the intermediate layer 2 or the masking layer 15' includes security elements, since any damage to the intermediate layer 2 and/or the masking layer 15' can lead to deterioration of the security elements or to a change in the optical, electrical, or magnetic signal, which change is suitable for being detected easily.

Figure 6:
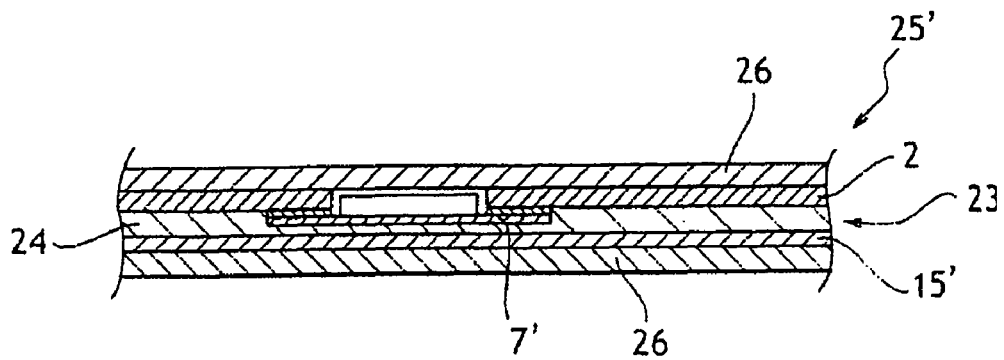

The structure 23 may also be incorporated in a document 25', as shown in FIG. 6, by previously treating the outside faces of the intermediate layer 2 and of the masking layer 15' so as to provide them with adhesive properties that are reactivatable when hot.

The paper layers 26 are then hot-laminated onto the structure 23.

Example 5

Figure 7:
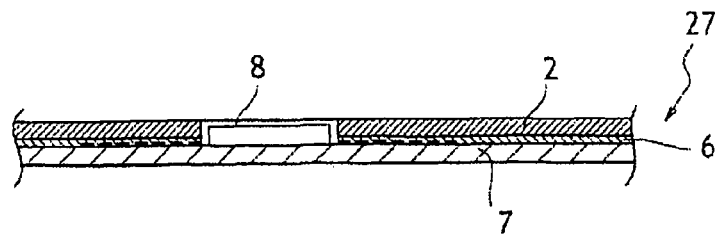
FIG. 7 is a diagrammatic and fragmentary cross-section view of a structure in accordance with another embodiment of the invention.

FIG. 7 shows a structure 27 comprising in succession:

an intermediate layer 2;

an adhesive layer 6; and a support 7 supporting the electronic device 8, the support 7 extending over the entire bottom face of the intermediate layer 2. The antenna is silkscreen-printed on the support 7, and the chip is housed in the window 4.

Figure 8:
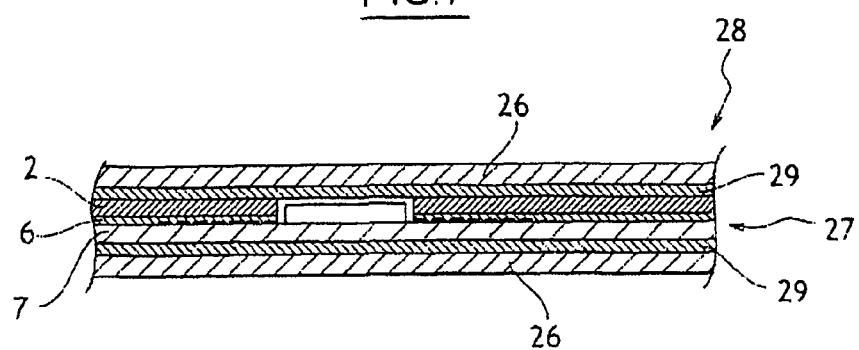
FIG. 8 is a diagrammatic and fragmentary cross-section view of a security document or document of value with the FIG. 7 structure.

By way of example, such a structure 27 can be used in making a security document 28 or document of value, as shown in FIG. 8.

The structure 27 may be laminated so as to be assembled with two layers of paper 26 via two layers of adhesive 29.

By way of example, each adhesive layer 29 is initially in the form of a film for transfer that is sandwiched between two anti-adhesion films, e.g. of the type comprising a layer of paper with a silicone coating.

It would not go beyond the ambit of the present invention for the electronic device to be of a type different from that described above.

Example 6

Figure 9:
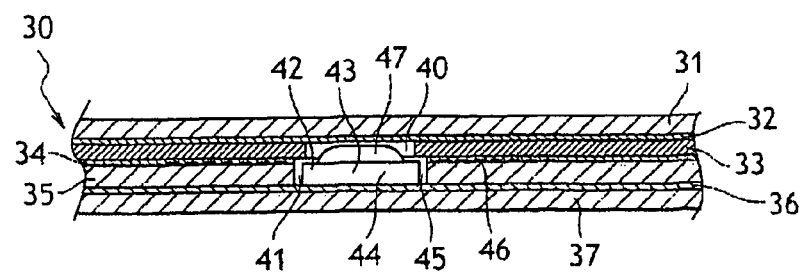
FIG. 9 is a diagrammatic and fragmentary cross-section view of a structure in accordance with another embodiment of the invention.

FIG. 9 shows a structure 30 comprising in succession:

a first masking layer 31;

a first adhesive layer 32;

a first intermediate layer 33 with a first window 40;

a second adhesive layer 34;

a second intermediate layer 35 with a second window 41 that is larger than the window 40;

a third adhesive layer 36; and a second masking layer 37.

An electronic device 42 is housed in the windows 40 and 41.

By way of example, each of the masking layers 31 and 37 includes a black core covered on its outside face in a white coating layer suitable for receiving printing.

By way of example, the white coating may include so-called "Hilite" fluorescent particles that are detectable under UV illumination at a wavelength of about 365 nm.

The white coating may also include security fibers, e.g. double-fluorescent security fibers that are excitable under UV radiation respectively at 254 nm and at 365 nm.

The masking layers 31 and 37 may also include, incorporated in the black core, tracers, e.g. of the Microtag type, that are suitable for being detected with a portable detector device.

Advantageously, the masking layers 31 and 37 are sufficiently opaque to make the electronic device 42 undetectable in transmitted light.

The adhesive layers 32, 34, and 36 contain an adhesive of the pressure-sensitive type, for example.

The adhesive layers 32 and 36 may be deposited initially in liquid form on the inside faces of the masking layers 31 and 37, i.e. on their respective black cores.

By way of example, the adhesive layer 34 is initially in the form of a transfer film.

The adhesive layers 32 and 36 in the example described are about 25 µm thick. The layer 34 may be thicker, so as to compensate for the thickness of the antenna, e.g. it may be slightly more than 100 µm thick.

The electronic device 42 may be constituted, for example, by a module 43 solder under the name MOA4 by the supplier Philips.

The module 43 occupies an area of about 42 mm², and presents a total thickness of 410 μm.

The module 43 has an integrated circuit in its bottom portion, or in a variant a plurality of integrated circuits, together with a connection circuit 44 having connection pads 45 connected to a wire type copper antenna 46 deposited on the intermediate layer 35, and the top portion of the module may comprise an encapsulating resin 47.

In the example described, the intermediate layer 33 is a fiber layer based on cellulose fibers, presenting density of about 320 g/m² and thickness of about 400 μm.

The window 40 in the intermediate layer 33 receives the encapsulating resin 47 of the module 43, this encapsulating resin 47 presenting thickness of about 330 μm and occupying an area of about 25 mm² in the example shown.

In the example described, the intermediate layer 33 presents a white color and may contain security elements, e.g. invisible luminescent tracers that fluoresce yellow, and that are detectable using a UV lamp at a wavelength of about 365 nm.

By way of example, the intermediate layer 33 may also include tracers that are detectable with a portable X-ray fluorescence device, where said tracers may be those sold by the supplier KeyMasters Technologies.

In the example described, the intermediate layer 35 is a fiber layer, e.g. based on cellulose fibers, e.g. white in color, presenting density of about 90 g/m² for a thickness of about 125 μm, for example.

The window 41 of the intermediate layer 35 receives the connection circuit 44 of the module, the connection circuit 44 presenting a thickness of about 120 μm, for example.

The intermediate layer 35 may include security elements, e.g. such as invisible luminescent tracers that fluoresce red and that are detectable using a UV lamp at a wavelength of 365 nm.

In the example described, the intermediate layer 35 presents cohesion, as measured with the Scott Bond device, that is less than or equal to that of the intermediate layer 33 and to that of the masking layers 31 and 37.

The adhesive layer 34 presents adhesive power and cohesion that are greater than the internal cohesion of the intermediate layers 33 and 35.

There follows a description in greater detail of the steps for making the structure 30.

The adhesive layer 34 is initially sandwiched between two removable anti-adhesion films (not shown).

After one of the two anti-adhesion films has been removed, the adhesive layer 34 is cold-laminated onto a face of the intermediate layer 33.

Thereafter, a window is made in the assembly constituted by the intermediate layer 33, the adhesive layer 34, and the anti-adhesion film on said adhesive layer 34.

The window may be made by a cutter machine provided with a punch.

A window is also made in the intermediate layer 35.

The wire antenna 46 of the electronic device 42 is deposited on one face of the intermediate layer 35.

The module 43 is inserted in the window 41 of the intermediate layer 35 in such a manner that the connection circuit 44 is received completely therein, being connected by the connection pads 45 to the antenna 46. This connection can be made by soldering, for example.

The anti-adhesion film still present on the adhesive layer 34 is removed.

The assembly constituted by the intermediate layer 33 and the adhesive layer 34 is assembled with the intermediate layer 35 in such a manner that the encapsulating resin 47 of the module 43 is housed in the window 40 of the intermediate layer 33, and the antenna is sandwiched between the intermediate layers 33 and 35. The adhesive layer 34 may contribute to holding the antenna, when the antenna is not printed but is constituted by wire.

Finally, the masking layers 31 and 37 that have previously received the pressure-sensitive adhesive layers 32 and 36 are laminated onto the assembly comprising the intermediate layers 33 and 35.

By way of example, the structure 30 as obtained in this way can receive printing using one or more inks, in particular one or more inks that react with chemicals, or one or more inks that are optically variable, and it can also receive a holographic patch.

It is also possible to personalize the structure via the white layers of the masking layers 31 and 37.

Figure 10:
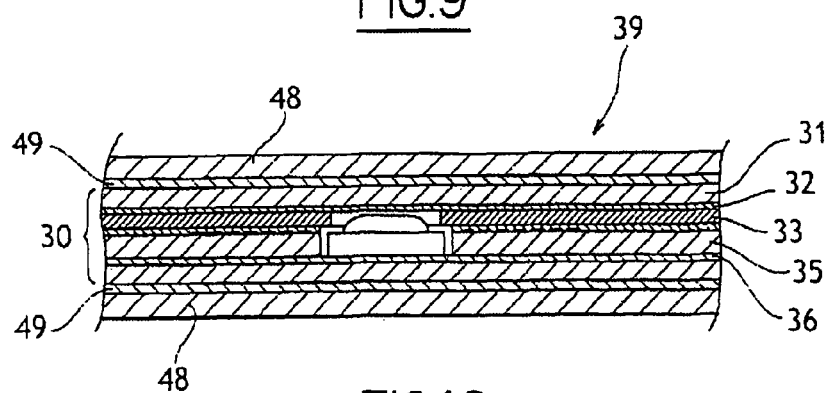
FIG. 10 is a diagrammatic and fragmentary cross-section view of a security document or document of value, with the FIG. 9 structure.

The resulting structure 30 can be inserted between two transparent plastics layers 48 and can be hot-laminated with these layers 48 via the adhesive layer 49, as shown in FIG. 10.

This produces an identity document 39 in the form of a card including the electronic device and that is ready for use.

The structure 30 assembled in the document extends to the edge of the document such that the security elements that are present, in particular in the intermediate layers 33 and 35, are visible at the edge and can be detected by appropriate means or visually.

Such an identity document can present the following advantages:
authentication securities:
  first level: optically variable ink(s), holographic patch, . . . ;
  second level: fluorescent particles and double-fluorescent fibers on both printed faces of the document, yellow and red fluorescent effect on the edge of the document, . . . ; and
  third level: Microtag and KeyMaster security respectively detectable with specific equipment; . . .
security against falsification:
  against chemical attacks: reagents in the security inks on each of the paper surfaces of the document giving rise to a colored spot that is visible on the surface of the card in the event of a chemical attack. Such chemical attacks can occur during attempts at opening the plastics layers or while attempting to erase inscriptions present on the printed surface of the document, or indeed during attempts at recovering the electronic device;
  against mechanical attacks: attempts at removing the electronic device lead to the intermediate layer 33 and/or the intermediate layer 35 being torn or delaminated. These attempts also lead to a loss of yellow and red fluorescence at the edge and to a modification to the signal delivered either by the KeyMaster tracers present in the intermediate layers or by the Microtag tracers present in the masking layers, with attempts at opening the document leading to the white layers being delaminated in the masking layers and thus damaging the inscriptions present.

Furthermore, the electronic device cannot be seen at all in the final document, neither in transmission, nor in reflection, thus improving the appearance of the card and of the printing present thereon.

Example 7

FIG. 11 shows a structure 50 in accordance with another embodiment of the invention and for use in making a security document or document of value, as explained below.

The structure 50 comprises in succession:
a first intermediate layer 51 with a first window 58;
a first adhesive layer 52;
a second intermediate layer 53 with a second window 59, that is larger than the first window 58;
a second adhesive layer 54; and
a masking layer 55.

By way of example, the first intermediate layer 51 is a fiber layer based on cellulose fibers, having density of about 270 g/m² and thickness of 350 μm.

By way of example, the first intermediate layer 51 is white, including security elements such as, for example, invisible tracers that fluorescence yellow-green, as sold under the reference SC4 by the supplier Angström, and visually detectable with a lamp that emits UV radiation at a wavelength of 365 nm, and also detectable in quantitative manner by using a scanner that is sold by Angström.

The structure 50 further includes an electronic device 60 of the contactless type comprising a support 61 made of inorganic material and having thickness of about 130 μm.

The device 60 further includes a chip protected by an encapsulating resin 62, e.g. having a thickness of about 330 μm.

The support 61 carries a wire antenna 63 made of copper.

By way of example, the support 61 may present a section of 4.7 centimeters (cm) by 12 cm.

The window 58 of the intermediate layer 51 receives the encapsulating resin 62.

The second intermediate layer 53 in the example described is a fiber layer based on cellulose fibers having density of 100 g/m² and thickness of about 130 μm, this thickness being substantially equal to the thickness of the support 61.

By way of example, the intermediate layer 53 is white paper, and may include security elements such as invisible luminescent tracers SC10 that fluoresce red and that can be detected visually with a UV lamp emitting UV radiation at a wavelength of 365 nm, and that can also be detected in quantitative manner with a scanner sold by the supplier Angström.

In the example described, the intermediate layer 51 presents internal cohesion that is less than or equal to that of the intermediate layer 53. The intermediate layer presents internal cohesion that is less than or equal to that of the masking layer 55. The adhesion between the first intermediate layer 51 and the second intermediate layer 53 is stronger than the cohesion of the intermediate layer 51. The adhesion between the masking layer 55 and the intermediate layer 53 is stronger than the cohesion of the intermediate layer 53. The adhesive layers 52 and 54 present adhesive power and cohesion that are stronger than the cohesion of the intermediate layers 51 and 53 and of the masking layer 55.

In the example described, the masking layer 55 is black, with the dye or the pigment used for coloring it black preferably withstanding migration under predetermined conditions of temperature and humidity, for example 80% relative humidity at 65° C. with a contact pressure less than 1 kilogram per square centimeter (kg/cm²), for example.

The adhesive layers 52 and 54 comprise an adhesive that is of the pressure-sensitive type, for example, and they are applied in liquid form. By way of example, the adhesive layers present thickness of about 25 μm.

There follows a description in greater detail of the steps for making the structure 50.

The intermediate layer 51 receives on its inside face a layer of adhesive 52 in liquid form.

The masking layer 55 also receives on its inside face a layer of adhesive 54 in liquid form.

A window is then made, in particular using a cutter machine provided with a laser, through the assembly constituted by the intermediate layer 51, the adhesive layer 52, and an anti-adhesion film fitted to the adhesive layer 52.

A window is also made in the intermediate layer 53.

Thereafter, once the anti-adhesion film on the adhesive layer 52 has been removed, the intermediate layer 51 is assembled with the electronic device 60, the intermediate layer 53, and the masking layer 55, using a specific machine.

The support 61 of the electronic device is housed in the window 59 of the intermediate layer 53 and the chip with the encapsulating resin 62 is housed in the window 58 of the intermediate layer 51.

Example of a Passport Booklet

The structure 50 as obtained in this way can be used in making a passport booklet 80, for example.

Figure 14:
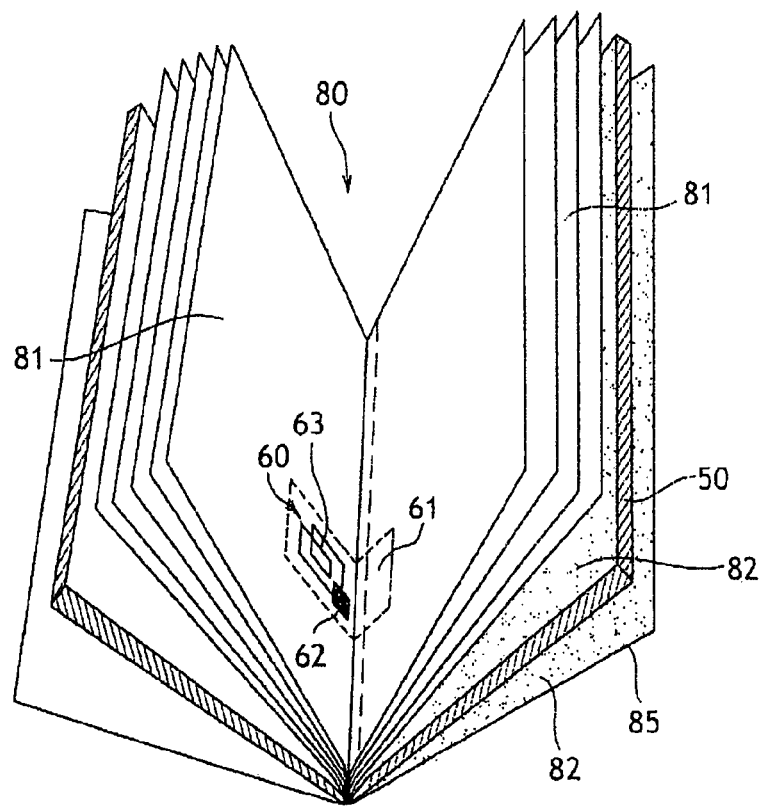
FIG. 14 is a diagrammatic and fragmentary view of a security document in accordance with the invention with a structure stitched thereon.
Figure 15:
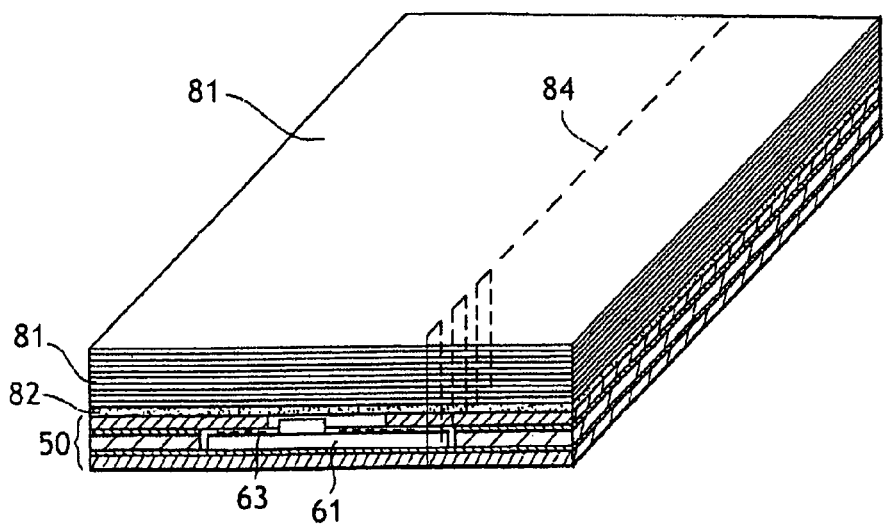
FIG. 15 is a diagrammatic and fragmentary view of a set of sheets and a structure for stitching together to form the document of FIG. 14.

The passport booklet 80 can be made by implementing the following steps on an assembly machine:
assembling the structure 50 with a set of sheets 81 comprising visa pages and security films, assembly being implemented via the flyleaf using a liquid adhesive 82, as shown in FIG. 15;
stitching the set of sheets 81 and the structure 50 in centered manner, the stitching being performed in such a manner that the set of sheets and a portion of the support 61 of the electronic device 60 are stitched together, as shown in FIG. 15. The stitching 84 is implemented away from the antenna 63 and the electronic chip of the device 60 so as to avoid interfering with the operation of the electronic device 60;
assembling the stitched-together structure and sheets 81 with a textile type sheet 85 coated in a liquid adhesive 82 so that the structure 50 is sandwiched between the paper sheets and the coated textile sheet, as shown in FIG. 14;
decorating the final cover on its coated face by laying foil by hot transfer; and
folding the booklet at the stitching.

The security document as made in this way can present the following advantages:
security against falsification and in particular against mechanical attacks:
any attempt at removing the electronic device is made very difficult since the electronic device is stitched to the passport as a whole;
any attempt at removing the electronic device by peeling and removing the thread of the stitching leads to visible delamination of the intermediate layer 51 or 53 and interferes with recognition of the yellow and red fluorescence at the edge of the cover, whether viewed visually or detected automatically with the Angstrom scanner;
authentication security:
second level: yellow and red fluorescent effect on the edge of the passport; and
third level: measuring the spectral signature of the fluorescence at the edge by using a dedicated scanner.

Furthermore, the electronic device cannot be seen in the cover of the final passport booklet, whether in transmission or in reflection.

In a variant, the structure 50 can be incorporated in a security document 70 by being laminated between two layers of paper 71 by using two layers of adhesive 72, as shown in FIG. 12.

Other Structure Examples

There follows a detailed description of the various steps in a method of making a structure in accordance with an embodiment of the invention, the structure including an electronic chip of the flip-chip type.

Figure 17:
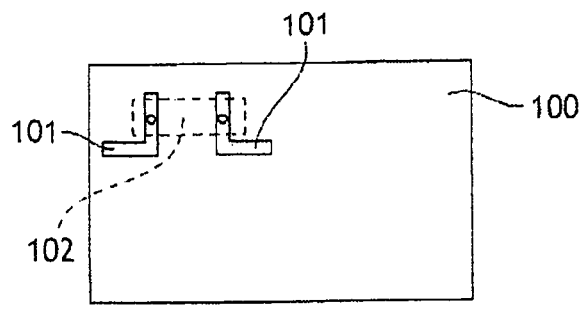
FIGS. 17 to 22 are diagrammatic and fragmentary views showing different steps in making a structure in accordance with the invention.

The initial step is making a plurality of conductive tracks 101 on a support 100, e.g. of glass epoxy, as shown in FIG. 17.

Figure 18:
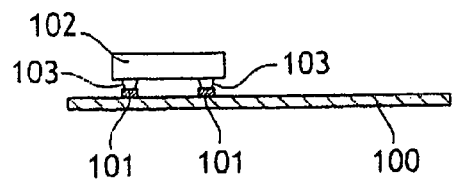

Then a flip-chip type electronic chip 102 is fitted on the support 100, with the contact pads or "bumps" 103 of the chip 102 being placed on the conductive tracks 101 and soldered thereto, as shown in FIG. 18.

The soldering may be of the gold-on-gold type, the contact pads or "bumps" of the chip being made on the basis of gold, in particular.

Thereafter, an insulating layer may be added to hold the chip 102 on the support 100.

Figure 19:
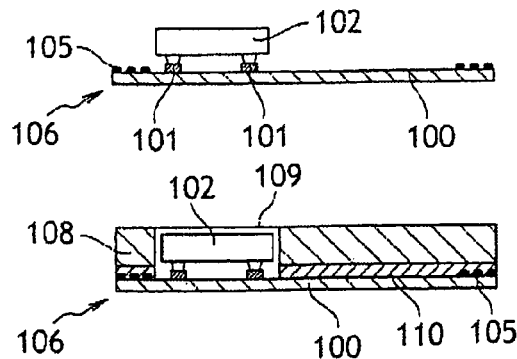

In the following step, as shown in FIG. 19, a wire antenna 105 is connected to the conductive tracks 101, preferably by soldering.

Figure 20:
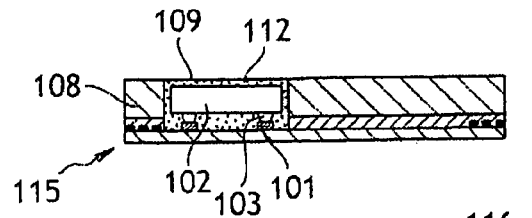

The electronic device 106 as made in this way, comprising the support 100, the chip 102, and the antenna 105, is assembled with a fiber layer 108, including a window 109 for fully receiving the chip 102, as shown in FIG. 20.

The device 106 is assembled with the layer 108 by using an adhesive layer 110, e.g. comprising a hot-melt adhesive.

The antenna 105 comes into contact with the adhesive layer 110.

Figure 21:
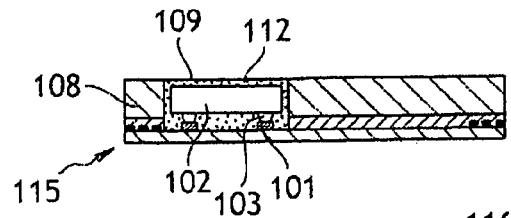

The following step, shown in FIG. 21, comprises casting an encapsulating resin 112 into the window 109 so as to coat the chip 102 and also the contact pads 103 and the conductive tracks 101.

The resin 112 serves to provide cohesion for the electronic device 106, and also to anchor it within the layer 108 to which the resin 112 adheres.

Figure 22:
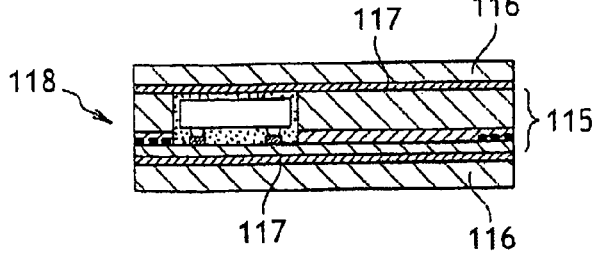

The resulting assembly 115 forms a structure suitable for being laminated with two layers of paper 116 via two layers of adhesive 117 so as to form a security document and/or a document of value 118, as shown in FIG. 22.

Figure 23:
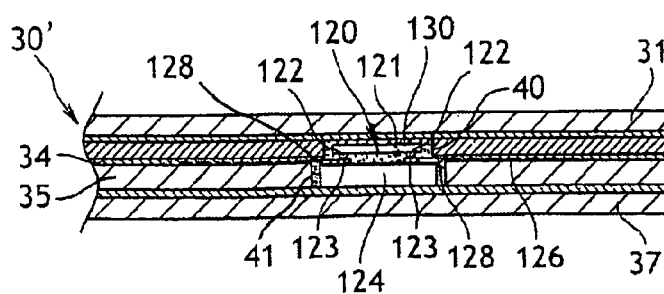
FIG. 23 is a diagrammatic and fragmentary cross-section view of a structure in accordance with a variant embodiment of the invention.

FIG. 23 shows a structure 30' in accordance with another embodiment of the invention that differs from the structure 30 described with reference to FIG. 9 by the fact that the structure 30' has an electronic device 120 with a flip-chip type electronic chip 121 that initially does not have any encapsulating resin. The contact pads 122 of the chip 121 are fastened on conductive tracks 123 made on a support 124, e.g. of glass epoxy, that is housed in the window 41 of the intermediate layer 35.

In the example described, the support 124 does not carry the antenna 126, the antenna being deposited on the second intermediate layer 35 and being connected to the conductive tracks 123 of the support 124 by connection tabs 128.

An encapsulating resin 130 is deposited in the first and second windows 40 and 41 once the chip 121 and the support 124 have been placed therein.

Naturally, the invention is not limited to the embodiments described above.

In particular, the characteristics of the various above-described embodiments can be combined with one another in variants that are not shown.

Throughout the description, including in the claims, the term "comprising a" should be understood as being synonymous with "comprising at least one" unless specified to the contrary.

The invention claimed is:

1. A method of making a structure for making a security document and/or a document of value or for making an article secure, the structure comprising at least one electronic device and at least one at least partially fibrous layer having a window arranged to receive the electronic device, at least in part, the method comprising:

placing at least part of the electronic device in the window in the layer; and then depositing a resin in the window so as to encapsulate the electronic device, at least in part, wherein the structure further comprises:

a wire antenna; and a layer of adhesive, in the thickness of which the wire antenna is received;

the method further comprising:

depositing on the layer of the structure the layer of adhesive enabling said layer of the structure to be assembled with an adjacent layer of the structure or the security document and/or the document of value, the adhesive having adhesive power and cohesion that are sufficiently great to ensure that an attempt at separating the layers spoils at least one of the two layers.

2. A method according to claim 1, wherein the layer contains paper-making fibers.

3. A method according to claim 1, wherein the resin is a thermosetting resin.

4. A method according to claim 1, wherein the resin is an epoxy resin.

5. A method according to claim 1, wherein the resin is deposited in the window while in the liquid or viscous state.

6. A method according to claim 1, wherein the electronic device does not have any encapsulating resin when the electronic device is inserted in the window.

7. A method according to claim 1, wherein the electronic device comprises a flip-chip type electronic chip.

8. A method according to claim 7, wherein the electronic device comprises a support carrying the electronic chip.

9. A method according to claim 8, wherein the electronic chip is fastened on the support prior to assembly with the layer, contact pads of the chip being soldered to conductive tracks of the support.

10. A method according to claim 9, the support having at least one conductive track electrically connected to the electronic chip, wherein the wire antenna is connected to the conducive track before assembling with the layer.

11. A method according to claim 9, wherein the wire antenna is fastened on a layer of the structure prior to being connected electrically to the electronic chip.

12. A method according to claim 1, wherein the electronic device presents thickness less than 500 µm.

13. A method according to claim 1, wherein the electronic device presents an area greater than 1 mm$^2$.

14. A method according to claim 1, comprising:

depositing on the layer of the structure the layer of adhesive enabling said layer of the structure to be assembled with an adjacent layer of the structure or the security document and/or document of value, the adhesive being a hot-melt adhesive.

15. A structure for making a security document and/or a document of value or for making an article secure, the structure comprising:

an electronic device;

an at least partially fibrous layer having a window in which at least part of the electronic device extends;

an encapsulating resin encapsulating the electronic device and adhering to said layer;

a wire antenna;

a layer of adhesive, in the thickness of which the wire antenna is received, the layer of adhesive being in contact with said at least partially fibrous layer; and the structure includes an adjacent layer assembled with said at least partially fibrous layer via the adhesive layer, the adhesive having adhesive power and cohesion that are sufficiently strong for an attempt at separating the intermediate layer from the adjacent layer to spoil at least the intermediate layer; and said adjacent layer being one of: a layer including a window; a masking layer; and a support for the electronic device.

16. A structure according to claim 15, wherein the encapsulating resin presents adhesive power and cohesion that are sufficiently strong to ensure that an attempt at separating the electronic device from said layer spoils at least said layer.

17. A structure according to claim 16, wherein the electronic device comprises a flip-chip type chip.

18. A structure according to claim 17, wherein the encapsulating resin coats the contact pads of the chip, at least in part.

19. A structure according to claim 15, wherein the encapsulating resin is a thermosetting resin.

* * * * *